(12) United States Patent
Lee et al.

(10) Patent No.: US 11,935,916 B2
(45) Date of Patent: *Mar. 19, 2024

(54) DIELECTRIC THIN-FILM STRUCTURE AND ELECTRONIC DEVICE INCLUDING THE SAME

(71) Applicant: Samsung Electronics Co., Ltd., Suwon-si (KR)

(72) Inventors: Hyangsook Lee, Suwon-si (KR); Junghwa Kim, Yongin-si (KR); Eunha Lee, Seoul (KR); Jeonggyu Song, Seongnam-si (KR); Jooho Lee, Suwon-si (KR); Myoungho Jeong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/154,218

(22) Filed: Jan. 13, 2023

(65) Prior Publication Data

US 2023/0154973 A1 May 18, 2023

Related U.S. Application Data

(63) Continuation of application No. 17/344,475, filed on Jun. 10, 2021, now Pat. No. 11,569,341.

(30) Foreign Application Priority Data

Feb. 8, 2021 (KR) .......................... 10-2021-0017866

(51) Int. Cl.
*H01L 29/08* (2006.01)
*H01L 21/02* (2006.01)
*H01L 49/02* (2006.01)

(52) U.S. Cl.
CPC ........ *H01L 28/55* (2013.01); *H01L 21/02181* (2013.01); *H01L 21/02189* (2013.01);
(Continued)

(58) Field of Classification Search
CPC ......... H01L 21/02181; H01L 21/02189; H01L 21/02609; H01L 21/02194;
(Continued)

(56) References Cited

U.S. PATENT DOCUMENTS 6,258,459 B1  7/2001 Noguchi et al.
6,955,927 B2  10/2005 Murai
(Continued)

FOREIGN PATENT DOCUMENTS

JP     3517876 B2     4/2004
KR  10-2018-0133167 A  12/2018
(Continued)

OTHER PUBLICATIONS

Notice of Allowance dated Sep. 23, 2022 in U.S. Appl. No. 17/344,475.

*Primary Examiner* — Jose R Diaz
(74) *Attorney, Agent, or Firm* — Harness, Dickey & Pierce, P.L.C.

(57) ABSTRACT

Provided are dielectric thin-film structures and electronic devices including the same. The dielectric thin-film structure includes a substrate, and a dielectric layer provided on the substrate. The dielectric layer including a tetragonal crystal structure, and crystal grains including a proportion of the crystal grains preferentially oriented such that at least one of a <hk0>, <h00>, or <0k0> direction of a crystal lattice is parallel to or forms an angle of less than 45 degrees an out-of-plane orientation.

20 Claims, 19 Drawing Sheets
(3 of 19 Drawing Sheet(s) Filed in Color)

(52) U.S. Cl.
CPC .. *H01L 21/02433* (2013.01); *H01L 21/02516* (2013.01); *H01L 21/02609* (2013.01); *H01L 28/60* (2013.01); *H01L 29/0847* (2013.01)

(58) Field of Classification Search
CPC ......... H01L 21/02304; H01L 21/02433; H01L 21/02516; H01L 28/55; H01L 28/40; H01L 28/90; H01L 28/60; H10B 12/033; H10B 12/30
See application file for complete search history.

(56) References Cited

U.S. PATENT DOCUMENTS

| | | |
|---|---|---|
| 10,854,709 B2 | 12/2020 | Jung et al. |
| 10,978,552 B2 | 4/2021 | Kang et al. |
| 11,017,830 B1 | 5/2021 | Lin et al. |
| 11,569,341 B2 * | 1/2023 | Lee .................... H01L 29/0847 |
| 2018/0350940 A1 | 12/2018 | Yoo |
| 2020/0127079 A1 | 4/2020 | Kim et al. |

FOREIGN PATENT DOCUMENTS

| | | |
|---|---|---|
| KR | 10-2019-0132143 A | 11/2019 |
| KR | 10-2020-0032966 A | 3/2020 |
| KR | 10-2020-0046166 A | 5/2020 |
| KR | 10-2022-0059878 A | 5/2022 |

* cited by examiner

DIELECTRIC THIN-FILM STRUCTURE AND ELECTRONIC DEVICE INCLUDING THE SAME

CROSS-REFERENCE TO RELATED APPLICATIONS

This application is a Continuation of U.S. application Ser. No. 17/344,475, filed on Jun. 10, 2021, which claims priority under 35 U.S.C. § 119 to Korean Patent Application No. 10-2021-0017866, filed on Feb. 8, 2021, in the Korean Intellectual Property Office, the disclosures of each of which are incorporated by reference herein in their entirety.

BACKGROUND

1. Field

The present disclosure relates to dielectric thin-film structures and electronic devices including the same.

2. Description of the Related Art

As the electronic apparatuses undergo down-scaling, the space occupied by various electronic devices in the electronic apparatuses is also becoming smaller. Therefore, there is a need to reduce the size of electronic devices (such as capacitors) and to reduce a thickness of a dielectric layer of the capacitor. However, when the dielectric layer of the capacitor is excessively thin, a breakdown voltage may decrease and/or a leakage current may increase.

SUMMARY

Provided are dielectric thin-film structures and electronic devices including the same.

Additional aspects will be set forth in part in the description which follows and, in part, will be apparent from the description, or may be learned by practice of the presented embodiments of the disclosure.

According to an aspect of an embodiment, a dielectric thin-film structure includes a substrate; and a dielectric layer on the substrate, the dielectric layer including a tetragonal crystal structure, and crystal grains including a proportion of crystal grains preferentially grown such that at least one of a <hk0>, <h00>, or <0k0> direction of a crystal lattice is parallel to or forms an angle of less than 45 degrees with an out-of-plane orientation.

The dielectric layer may include at least one of hafnium oxide, zirconium oxide, or hafnium zirconium oxide.

The proportion of the preferentially grown crystal grains in the dielectric layer may be 10% or more.

The dielectric layer may be grown on the substrate. The substrate may include titanium nitride preferentially grown in a <111> direction. The substrate may include cobalt titanium nitride preferentially grown in a <111> direction.

The dielectric thin-film structure may further include a material layer between the substrate and the dielectric layer.

The material layer may include at least one of niobium titanium oxide or silver oxide. The dielectric layer may include crystal grains preferentially grown in a <110> direction.

The material layer may include niobium nitride. The dielectric layer may include crystal grains preferentially grown in a <100> direction.

According to an aspect of another embodiment, a capacitor includes a lower electrode; an upper electrode; and a dielectric layer between the lower electrode and the upper electrode, the dielectric layer including a tetragonal crystal structure, and crystal grains including a proportion of crystal grains preferentially grown such that at least one of <hk0>, <h00>, or <0k0> direction of a crystal lattice is parallel to or forms an angle of less than 45 degrees with an out-of-plane orientation.

The dielectric layer may include at least hafnium oxide, zirconium oxide, or hafnium zirconium oxide.

The proportion of the preferentially grown crystal grains in the dielectric layer may be 10% or more.

The dielectric layer may be grown on the lower electrode. The lower electrode may include titanium nitride or cobalt titanium nitride grown in a <111> direction.

The capacitor may further include a material layer between the dielectric layer and at least one of the lower electrode or the upper electrode. The material layer may include at least one of niobium titanium oxide, silver oxide, or niobium nitride.

According to an aspect of another embodiment, an electronic apparatus includes a field effect transistor; and the above-described capacitor electrically connected to the field effect transistor.

The field effect transistor may include a semiconductor layer including a source and a drain, a gate insulating layer provided on the semiconductor layer, and a gate electrode provided on the gate insulating layer.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other aspects, features, and advantages of certain embodiments of the disclosure will be more apparent from the following description taken in conjunction with the accompanying drawings, in which.

DETAILED DESCRIPTION

Figure 1:
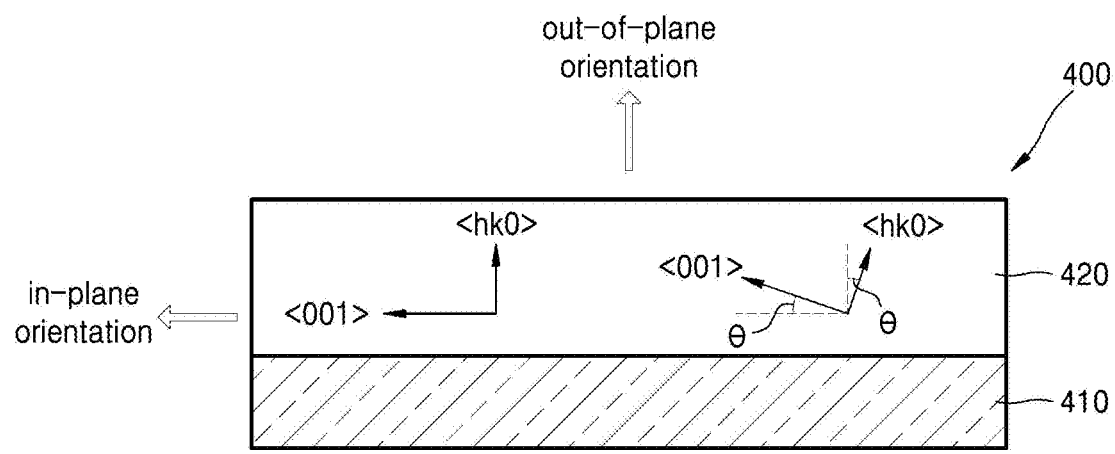
FIG. 1 illustrates a dielectric thin-film structure according to an example embodiment.

Reference will now be made in detail to some example embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, example embodiments will be described in detail with reference to the accompanying drawings. In the following drawings, the size of each element in the drawings may be exaggerated for clarity and convenience of explanation. The following embodiments are merely examples, and various modifications may be made from these embodiments.

Hereinafter, the terms "above" or "on" may include not only those that are directly above, below, left, and right in a contact manner, but also those that are above, below, left, and right in a non-contact manner. The singular forms "a," "an," and "the" as used herein are intended to include the plural forms as well unless the context clearly indicates otherwise. It will be understood that the terms "comprise," "include," or "have" as used herein specify the presence of stated elements, but do not preclude the presence or addition of one or more other elements.

Spatially relative terms, such as "lower," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, the example terms "lower" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

When the terms "about" or "substantially" are used in this specification in connection with a numerical value, it is intended that the associated numerical value includes a manufacturing tolerance (e.g., ±10%) around the stated numerical value. Moreover, when "close" and/or "substantially" is used in connection with geometric shapes and/or orientations, it is intended that precision of the geometric shape and/or orientation is not required but that latitude for the shape is within the scope of the disclosure. Further, regardless of whether numerical values or shapes are modified as "about," "close," or "substantially," it will be understood that these values and shapes should be construed as including a manufacturing or operational tolerance (e.g., ±10%) around the stated numerical values, orientations, and/or shapes.

The use of the term "the" and similar demonstratives may correspond to both the singular and the plural. Steps constituting methods may be performed in any suitable order unless otherwise indicated herein or otherwise clearly contradicted by context, and are not necessarily limited to the stated order.

In addition, the terms such as "unit" and "module" described in the specification mean units that process at least one function or operation, and may be implemented as hardware, software, or a combination of hardware and software.

Connecting lines or connecting members illustrated in the drawings are intended to represent exemplary functional relationships and/or physical or logical connections between the various elements. It should be noted that many alternative or additional functional relationships, physical connections, and/or logical connections may be present in a practical device.

The use of all illustrations and/or illustrative terms in the embodiments is simply to describe the embodiment in detail, and the scope of the present disclosure is not limited due to the illustrations or illustrative terms unless they are limited by claims.

FIG. 1 illustrates a dielectric thin-film structure 400 according to an example embodiment.

Referring to FIG. 1, the dielectric thin-film structure 400 includes a substrate 410 and a dielectric layer 420 provided on the substrate 410. The dielectric layer 420 may be formed in a form of a thin film having a nanoscale thickness. For example, the dielectric layer 420 may have a thickness of 10 nm or less (for example, 5 nm or less). In FIG. 1, an out-of-plane orientation is a preferred orientation of the dielectric layer 420 and indicates a direction toward the front surface of the dielectric layer 420. For example, the dielectric layer 420 may have a higher dielectric constant in the out-of-plane orientation when compared to another orientation (e.g., the in-plane orientation) and/or, as will be describe later, the dielectric layer 420 may include crystal grains in which the <hk0>, <h00>, and/or <0k0> direction of the crystal lattice are aligned parallel to the out-of-plane orientation. The out-of-plane orientation of the dielectric layer 420 is perpendicular to the upper surface of the substrate 410 and/or the upper surface of the dielectric layer 420. An in-plane orientation is perpendicular to the out-of-plane orientation and indicates a direction toward an end surface of the dielectric layer 420. The in-plane orientation of the dielectric layer 420 may be parallel to the upper surface of the substrate 410 and/or the upper surface of the dielectric layer 420.

The dielectric layer 420 may include a dielectric material having a high dielectric constant. For example, the dielectric layer 420 may have a dielectric constant higher than silicon oxide ($SiO_2$). In some embodiments, the dielectric layer 420 may include hafnium oxide ($HfO_2$), zirconium oxide ($ZrO_2$), and/or hafnium zirconium oxide ($Hf_xZr_{1-x}O_2$, $0<x<1$). The dielectric layer 420 may include an orthorhombic and/or tetragonal crystal structure. Because the dielectric layer 420 has an orthorhombic and/or tetragonal crystal structure and includes crystal grains grown in a specific direction, the dielectric layer 420 may have a high dielectric constant. When the dielectric layer 420 is applied to a capacitor, a high capacitance may be secured while the dielectric layer 420 is maintained at a constant thickness.

In general, the capacitance of the capacitor may be represented by Equation 1 below:

$$c = \frac{k\varepsilon_0 A}{t} \qquad \text{(Equation 1)}$$

wherein C represents the capacitance, k represents the dielectric constant of the dielectric layer, $\varepsilon_0$ represents the dielectric constant in vacuum, A represents the surface area of the capacitor, and t represents the thickness of the dielectric layer.

According to Equation 1, as the thickness of the dielectric layer decreases, the capacitance of the capacitor increases. However, when the dielectric layer of the capacitor becomes excessively thin, the breakdown voltage may decrease and/or the leakage current may increase. Therefore, a dielectric layer having a great dielectric constant is required in order to satisfy breakdown voltage and leakage current characteristics and secure a high capacitance while maintaining a constant and/or thin film thickness.

Hafnium oxide ($HfO_2$), zirconium oxide ($ZrO_2$), and/or hafnium zirconium oxide ($Hf_xZr_{1-x}O_2$, $0<x<1$) are dielectric materials having high dielectric constant. These dielectric materials are polycrystalline materials with polymorphism and have various crystal structures such as a monoclinic system, a tetragonal system, an orthorhombic system, and/or a cubic system. In various crystal structures, the tetragonal system may have the greatest dielectric constant. However, the dielectric constant may be affected by the orientation of the crystals structures. Therefore, as will be described later, even in the tetragonal crystal structure, a dielectric constant in a specific crystal orientation may be greater than a dielectric constant of a crystal structure in a random crystal orientation.

Figure 2:
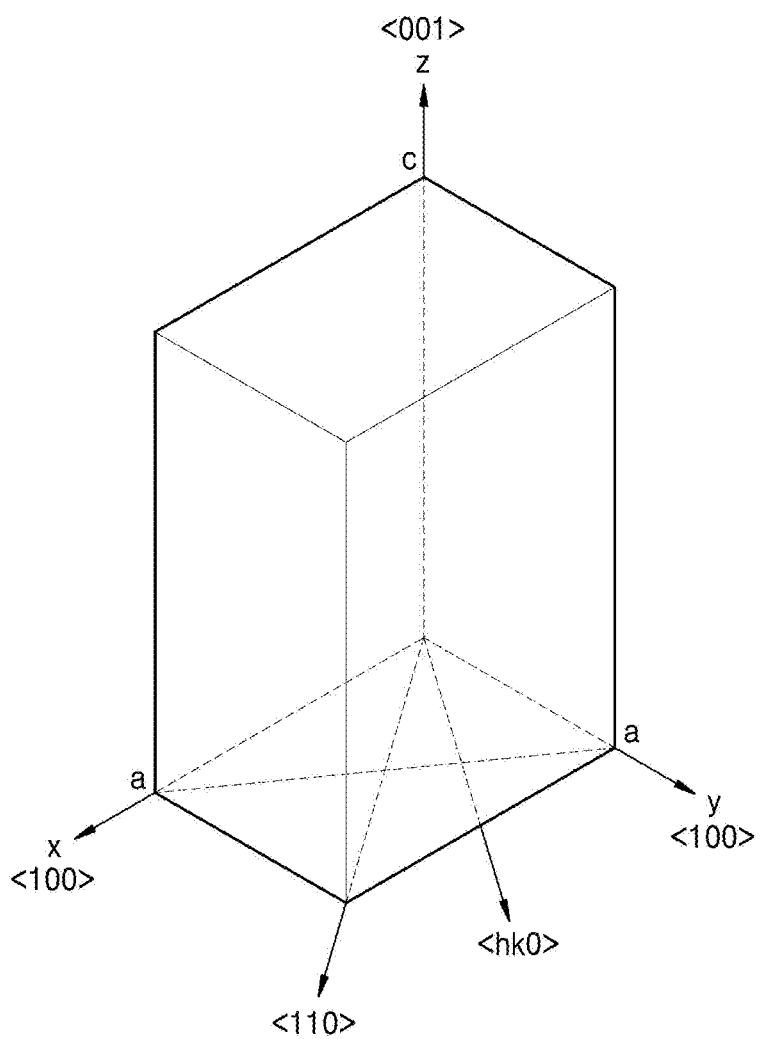
FIG. 2 illustrates a unit crystal lattice of a tetragonal crystal structure.

FIG. 2 illustrates a unit crystal lattice of a tetragonal crystal structure.

Referring to FIG. 2, x-axis, y-axis, and z-axis directions are perpendicular to each other. "a" represents a lattice constant in the x-axis and y-axis directions, and "c" ($\neq$a) represents a lattice constant in the z-axis direction. In the tetragonal crystal structure, the crystal orientations in the x-axis direction and the y-axis direction may be a <100> direction, and the crystal orientation in the z-axis direction may be a <001> direction. <hk0>, <h00>, and <0k0> directions (where h and k are natural numbers) indicate crystal orientations perpendicular to the <001> direction. The notations such as <100>, <001>, <hk0>, <h00>, and <0k0> represent Miller indices indicating the crystal orientations in the tetragonal crystal structure.

In hafnium oxide ($HfO_2$), zirconium oxide ($ZrO_2$), and/or hafnium zirconium oxide ($Hf_xZr_{1-x}O_2$, $0<x<1$) having the tetragonal crystal structure, the dielectric constant may vary according to the crystal orientation. For example, the dielectric constant may increase when the growth direction of crystal grains in the tetragonal crystal structure is closer to a specific crystal orientation, for example, the <100> direction and/or the <110> direction, and the dielectric constant may decrease when the growth direction of crystal grains is closer to the <001> direction.

In the present embodiment, the dielectric layer 420 may include hafnium oxide ($HfO_2$), zirconium oxide ($ZrO_2$), and/or hafnium zirconium oxide ($Hf_xZr_{1-x}O_2$, $0<x<1$) having the tetragonal crystal structure, and may include crystal grains grown in a specific direction.

The dielectric layer 420 may include crystal grains in which the <hk0>, <h00>, or <0k0> direction of the crystal lattice is arranged close to the out-of-plane orientation that is the preferred orientation. The h and/or k of the <hk0>, <h00>, or <0k0> directions may each comprise an x-vector corresponding to the x-axis, and/or a y-vector corresponding to the y-axis; wherein, for h the x-vector has a greater magnitude than the y-vector, and for k the y-vector has a greater magnitude than the x-vector. For example, the crystal grains may have been preferentially grown in a direction close to the <hk0>, <h00>, or <0k0> direction. The <hk0> direction may be, for example, the <100> direction, the <110> direction, and/or a direction between the <100> direction and the <110> direction. In this case, the <001> direction, which is the z-axis direction of the crystal lattice, may be aligned close to the in-plane orientation.

In some embodiments, the dielectric layer 420 may include crystal grains in which the <hk0>, <h00>, and/or <0k0> direction of the crystal lattice is aligned parallel to the out-of-plane orientation. For example, the crystal grains have been grown in the <hk0>, <h00>, and/or <0k0> direction (for example, the <100> and/or <110> direction). In this case, the <001> direction of the crystal lattice may be aligned parallel to the in-plane orientation.

The dielectric layer 420 may include crystal grains in which the <hk0>, <h00>, and/or <0k0> direction of the crystal lattice forms an angle ($\theta$) of less than 45 degrees with respect to the out-of-plane orientation. This means that the angle ($\theta$) between the <hk0> direction and the out-of-plane orientation is less than 45 degrees. In this case, the <001> direction of the crystal lattice may include crystal grains forming an angle ($\theta$) of less than 45 degrees with respect to the in-plane orientation.

The dielectric layer 420 may include hafnium oxide ($HfO_2$), zirconium oxide ($ZrO_2$) and/or hafnium zirconium oxide ($Hf_xZr_{1-x}O_2$, $0<x<1$) having the tetragonal crystal structure and includes crystal grains grown in a direction close to the <hk0>, <h00>, and/or <0k0> direction (e.g., grains in which the <001> direction of the crystal lattice is aligned close to the in-plane orientation). Thus, the dielectric layer 420 may have a high dielectric constant.

A proportion of the crystal grains grown in the dielectric layer 420 in a direction close to the <hk0>, <h00>, and/or <0k0> direction may be about 10% or more (for example, 20% or more, 30% or more, 40% or more, and/or 50% or more). The proportion refers to a proportion of crystal grains grown on the out-of-plane of the dielectric layer 420 in a direction close to the <hk0>, <h00>, and/or <0k0> direction.

The dielectric layer 420 may be directly grown and/or provided on the substrate 410. For example, in the case wherein the dielectric layer 420 is directly grown on the substrate 410, the dielectric layer 420 may be deposited and grown on the substrate 410 by, for example, atomic layer deposition (ALD). The substrate 410 may include a material preferentially grown in a specific direction. For example, as the substrate 410, a titanium nitride (TiN) substrate preferentially grown in a <111> direction and/or a cobalt titanium nitride (Co—TiN) substrate preferentially grown in a <111> direction may be used. In this case, a dielectric layer (for example, hafnium oxide ($HfO_2$), zirconium oxide ($ZrO_2$), and/or hafnium zirconium oxide ($Hf_xZr_{1-x}O_2$, 0<x<1)), which has a tetragonal crystal structure and includes crystal grains grown in a <110> direction, may be formed on the substrate 410.

An existing dielectric-based device may have used hafnium oxide, zirconium oxide, and/or hafnium zirconium oxide, which has a tetragonal crystal structure but in which crystal grains are grown in a random orientation. In this case, the dielectric constant decreases, compared with a case in which crystal grains are grown in a specific direction, as discussed above.

In the present example embodiments, the dielectric layer 420 may include hafnium oxide ($HfO_2$), zirconium oxide ($ZrO_2$), and/or hafnium zirconium oxide ($Hf_xZr_{1-x}O_2$, 0<x<1)), which has the tetragonal crystal structure, and includes crystal grains grown in a specific direction (e.g., a direction close to the <hk0>, <h00>, or <0k0> direction), and thus, the dielectric layer 420 may have a higher dielectric constant. When the dielectric layer 420 is applied to a capacitor, the breakdown voltage and/or the leakage current characteristics may be satisfied and a high capacitance may be secured while the dielectric layer 420 is maintained at a constant and/or thin film thickness.

Figure 3:
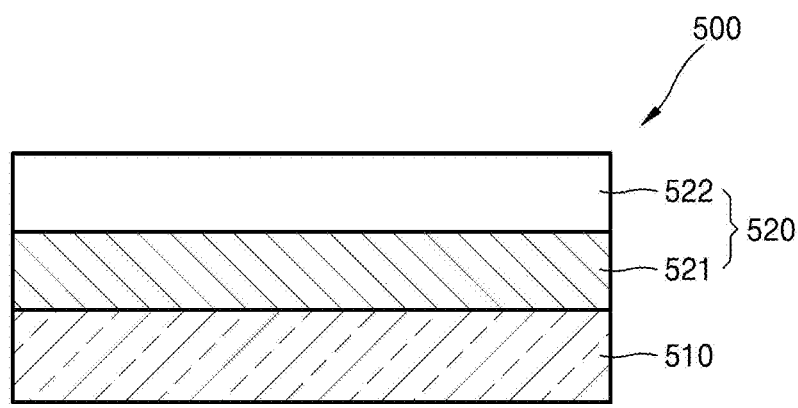
FIG. 3 illustrates a dielectric thin-film structure according to another example embodiment.

Although the case in which the dielectric layer 420 has a single layer structure has been described above, a dielectric layer 520 may have a multilayer structure in which different materials are stacked, as illustrated in FIG. 3.

Referring to FIG. 3, a dielectric thin-film structure 500 includes a substrate 510 and a dielectric layer 520 provided on the substrate 510. In some embodiments, the dielectric layer 520 may have a nanoscale thickness. For example, the dielectric layer 520 may have a thickness of 10 nm or less (for example, 5 nm or less).

The dielectric layer 520 may include at least a first dielectric layer 521 and a second dielectric layer 522 in which different materials are alternately stacked. Each of the first and second dielectric layers 521 and 522 may include hafnium oxide ($HfO_2$), zirconium oxide ($ZrO_2$), and/or hafnium zirconium oxide ($Hf_xZr_{1-x}O_2$, 0<x<1). For example, the first dielectric layer 521 may include hafnium oxide ($HfO_2$), and the second dielectric layer 522 may include zirconium oxide ($ZrO_2$). However, this is merely an example. In some embodiments, an interface between the first and second dielectric layers 521 and 522 may be indistinct. For example, in the case wherein the first dielectric layer 521 includes $HfO_2$ and the second dielectric layer 522 includes $ZrO_2$, the dielectric layer 520 may include hafnium zirconium oxide ($Hf_xZr_{1-x}O_2$, 0<x<1) at the interface between the first and second dielectric layers 521 and 522.

Each of the first and second dielectric layers 521 and 522 may have a tetragonal crystal structure and may include crystal grains grown in a specific direction (that is, a direction close to the <hk0>, <h00>, or <0k0> direction). Because this has been described above, a detailed description thereof will be omitted.

Although a case in which two different materials are stacked is illustrated in FIG. 3, three or more different material layers may be stacked, and the number of stacked layers may be variously changed.

Figure 4:
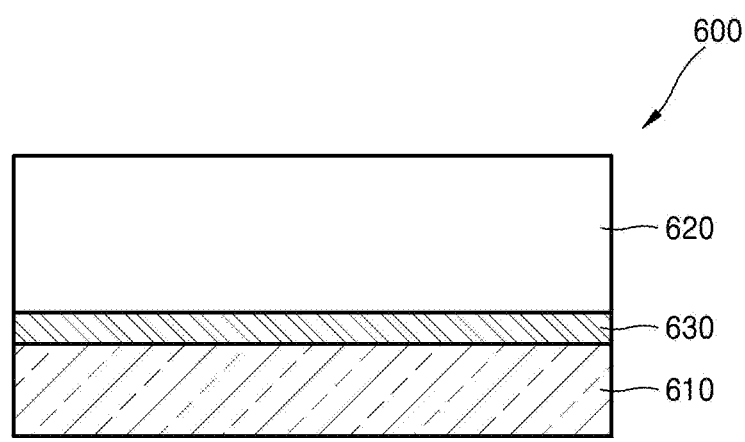
FIG. 4 illustrates a dielectric thin-film structure according to another example embodiment.

FIG. 4 illustrates a dielectric thin-film structure 600 according to another example embodiment.

Referring to FIG. 4, the dielectric thin-film structure 600 includes a substrate 610, a material layer 630 provided on the substrate 610, and a dielectric layer 620 provided on the material layer 630. The substrate 610 may include various materials.

The material layer 630 may be deposited on the substrate 610 by, for example, ALD. In some embodiments, the material layer 630 may act as a crystal seed growth layer and/or to reduce stress and/or strain due lattice mismatch between the substrate 610 and the dielectric layer 620. The material layer 630 may include, for example, niobium titanium oxide (Nb—$TiO_2$) and/or silver oxide ($AgO_2$). The dielectric layer 620 may be directly grown and/or provided on the material layer 630. The dielectric layer 620 may be deposited and grown on the material layer 630 by, for example, ALD. The dielectric layer 620 may have a thickness of 10 nm or less (for example, 5 nm or less). The dielectric layer 620 may have a single layer structure and/or a multilayer structure.

The dielectric layer 620 may include hafnium oxide ($HfO_2$), zirconium oxide ($ZrO_2$), and/or hafnium zirconium oxide ($Hf_xZr_{1-x}O_2$, 0<x<1), and/or may have a tetragonal crystal structure. In addition, the dielectric layer 620 may include crystal grains grown in a direction close to the <hk0>, <h00>, or <0k0> direction. For example, when the material layer 630 includes niobium titanium oxide (Nb—$TiO_2$) and/or silver oxide ($AgO_2$), the dielectric layer 620 including crystal grains preferentially grown in the <110> direction may be formed on the material layer 630. A proportion of the crystal grains grown in the dielectric layer 620 in the <110> direction may be about 10% or more (for example, 20% or more, 30% or more, 40% or more, and/or 50% or more).

Figure 5:
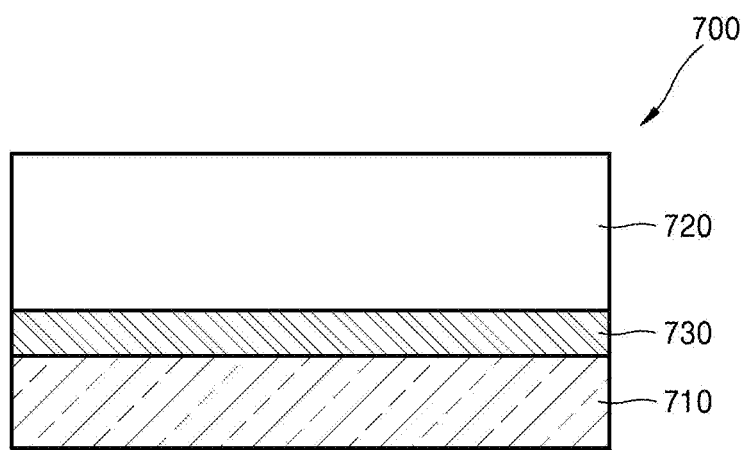
FIG. 5 illustrates a dielectric thin-film structure according to another example embodiment.

FIG. 5 illustrates a dielectric thin-film structure 700 according to another example embodiment.

Referring to FIG. 5, the dielectric thin-film structure 700 includes a substrate 710, a material layer 730 provided on the substrate 710, and a dielectric layer 720 provided on the material layer 730. The substrate 710 may include various materials.

The material layer 730 may be deposited on the substrate 710 by, for example, ALD. The material layer 730 may include, for example, niobium nitride (NbN). The dielectric layer 720 may be directly grown and provided on the material layer 730. The dielectric layer 720 may be deposited and grown on the material layer 730 by, for example, ALD. The dielectric layer 720 may have a thickness of 10 nm or less (for example, 5 nm or less). The dielectric layer 720 may have a single layer structure or a multilayer structure.

The dielectric layer 720 may include hafnium oxide ($HfO_2$), zirconium oxide ($ZrO_2$), or hafnium zirconium oxide ($Hf_xZr_{1-x}O_2$, 0<x<1), which has a tetragonal crystal structure. In addition, the dielectric layer 720 may include crystal grains grown in a direction close to the <hk0>, <h00>, or <0k0> direction. Specifically, when the material layer 730 includes niobium nitride (NbN), the dielectric layer 720 including crystal grains preferentially grown in the <100> direction may be formed on the material layer 730. A proportion of the crystal grains grown in the dielectric layer 720 in the <100> direction may be about 10% or more (for example, 20% or more, 30% or more, 40% or more, and/or 50% or more).

Figure 6A:
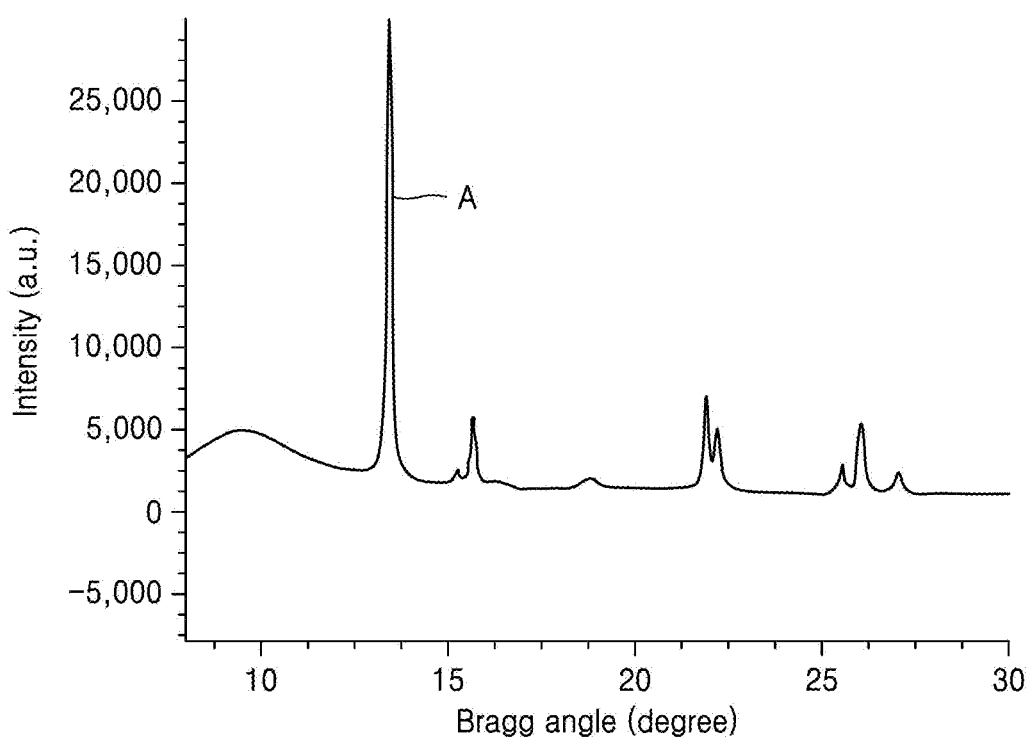
FIG. 6A illustrates a result of X-ray diffraction (XRD) analysis, showing a crystal orientation of a $ZrO_2/HfO_2$ dielectric layer ("A") that is grown on a TiN substrate preferentially grown in a <200> direction.
Figure 6B:
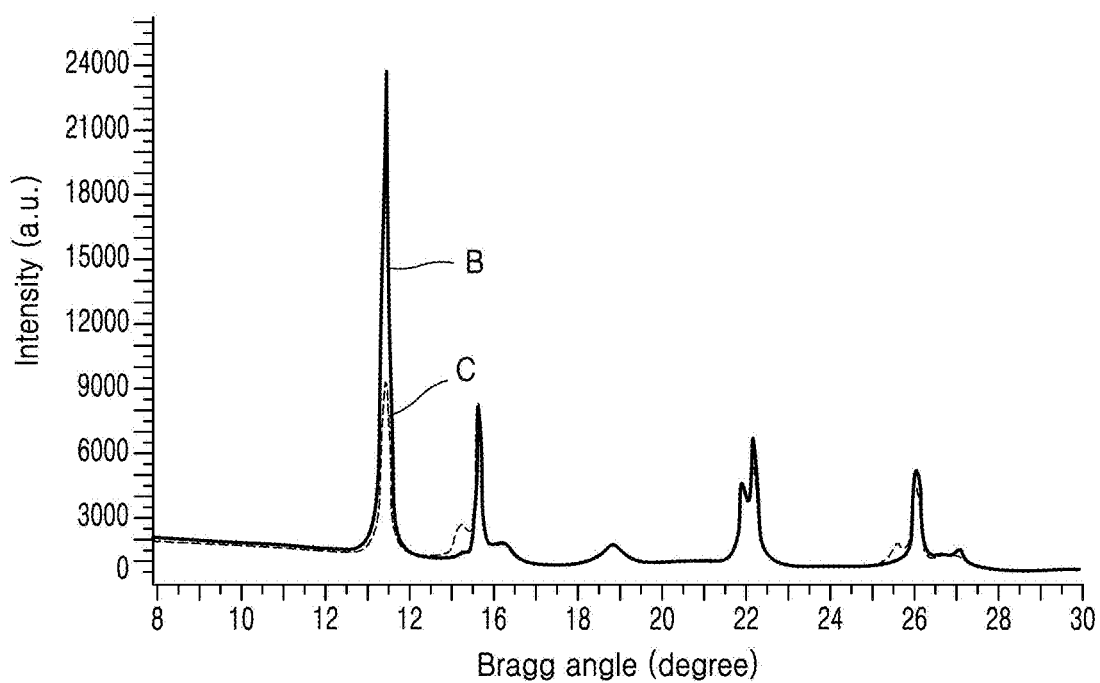
FIG. 6B illustrates a result of XRD analysis, showing a crystal orientation of a $ZrO_2/HfO_2$ dielectric layer ("B") that is grown on a TiN substrate preferentially grown in a <111> direction and a crystal orientation of a $ZrO_2/HfO_2$ dielectric layer ("C") that is grown on a TiN substrate/Nb—$TiO_2$ material layer preferentially grown in a <111> direction.

FIG. 6A illustrates a result of X-ray diffraction (XRD) analysis, showing a crystal orientation of a $ZrO_2$/$HfO_2$ dielectric layer ("A") that is grown on a TiN substrate preferentially grown in a <200> direction. FIG. 6B illustrates a result of XRD analysis, showing a crystal orientation of a $ZrO_2/HfO_2$ dielectric layer ("B") that is grown on a TiN substrate preferentially grown in a <111> direction and a crystal orientation of a $ZrO_2/HfO_2$ dielectric layer ("C") that is grown on a TiN substrate/Nb—$TiO_2$ material layer preferentially grown in a <111> direction. The $ZrO_2/HfO_2$ dielectric layer has a tetragonal crystal structure. FIGS. 6A and 6B show results measured in the out-of-plane orientation.

Referring to FIG. 6A, it may be confirmed that a $ZrO_2/HfO_2$ dielectric layer was grown in a random orientation on a TiN substrate preferentially grown in a <200> direction.

Referring to FIG. 6B, it may be confirmed that a $ZrO_2/HfO_2$ dielectric layer was preferentially grown in a <110> direction on a TiN substrate preferentially grown in a <111> direction. It may be confirmed that a $ZrO_2/HfO_2$ dielectric layer was preferentially grown in a <110> direction on a Nb—$TiO_2$ material layer.

Figure 7A:
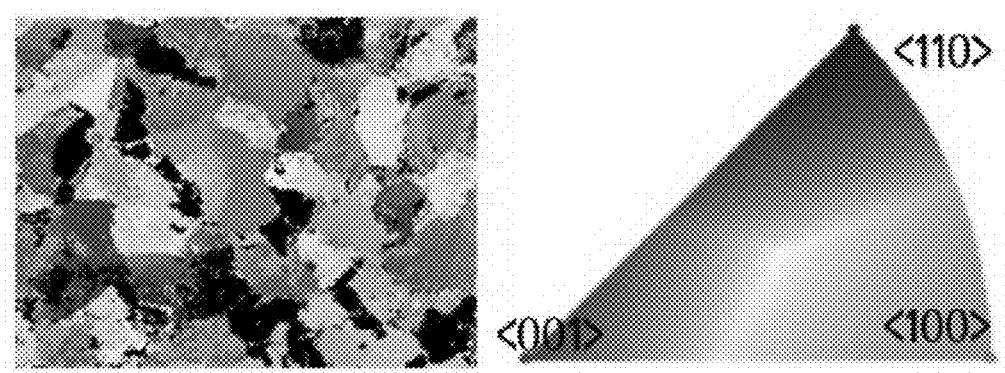
FIG. 7A illustrates a result of transmission electron microscope (TEM)-precession electron diffraction (PED) analysis, showing a crystal orientation distribution image of a $ZrO_2/HfO_2$ dielectric layer that is grown on a TiN substrate grown in a random orientation.
Figure 7B:
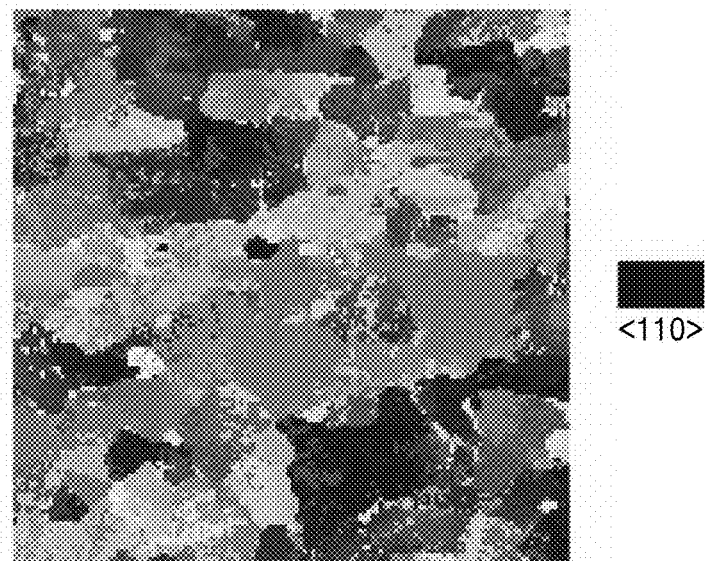
FIG. 7B illustrates a result of TEM-PED analysis, showing a crystal orientation distribution image of a $ZrO_2/HfO_2$ dielectric layer that is grown on a TiN substrate/Nb—$TiO_2$ material layer preferentially grown in a <111> direction.
Figure 7C:
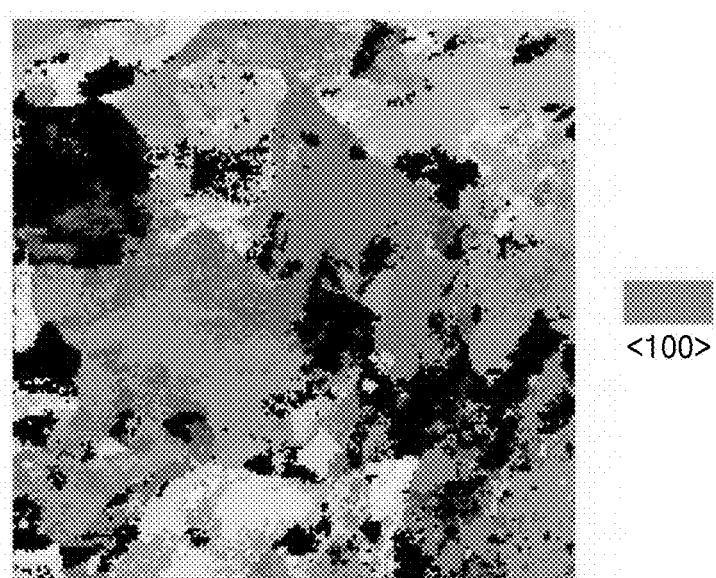
FIG. 7C illustrates a result of TEM-PED analysis, showing a crystal orientation distribution image of a $ZrO_2/HfO_2$ dielectric layer that is grown on a TiN substrate/NbN material layer preferentially grown in a <111> direction.

FIG. 7A illustrates a result of transmission electron microscope (TEM)-precession electron diffraction (PED) analysis, showing a crystal orientation distribution image of a $ZrO_2/HfO_2$ dielectric layer that is grown on a TiN substrate grown in a random orientation. FIG. 7B illustrates a result of TEM-PED analysis, showing a crystal orientation distribution image of a $ZrO_2/HfO_2$ dielectric layer that is grown on a TiN substrate/Nb—$TiO_2$ material layer preferentially grown in a <111> direction. FIG. 7C illustrates a result of TEM-PED analysis, showing a crystal orientation distribution image of a $ZrO_2/HfO_2$ dielectric layer that is grown on a TiN substrate/NbN material layer preferentially grown in a <111> direction. The $ZrO_2/HfO_2$ dielectric layer has a tetragonal crystal structure. FIGS. 7A to 7C are images measured in an out-of-plane orientation.

Referring to FIG. 7A, it may be confirmed that a $ZrO_2/HfO_2$ dielectric layer was grown in a random orientation on the TiN substrate grown in a random orientation. Referring to FIG. 7B, it may be confirmed that a $ZrO_2/HfO_2$ dielectric layer was preferentially grown on the Nb—$TiO_2$ material layer in a <110> direction. Referring to FIG. 7C, it may be confirmed that a $ZrO_2/HfO_2$ dielectric layer was preferentially grown on the NbN material layer in a <100> direction.

Figure 8:
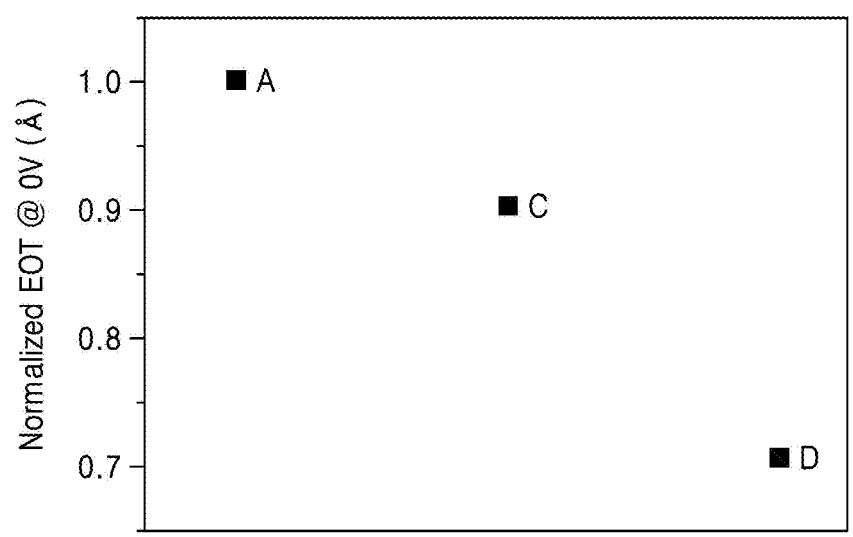
FIG. 8 illustrates results of measuring equivalent oxide thickness (EOT) of the $ZrO_2/HfO_2$ dielectric layers illustrated in FIGS. 7A to 7C.

FIG. 8 illustrates results of measuring equivalent oxide thickness (EOT) of the $ZrO_2/HfO_2$ dielectric layers illustrated in FIGS. 7A to 7C. In FIG. 8, "A" represents a $ZrO_2/HfO_2$ dielectric layer grown in a random orientation illustrated in FIG. 7A, "C" represents a $ZrO_2/HfO_2$ dielectric layer preferentially grown in a <110> direction illustrated in FIG. 7B, and "D" represents a $ZrO_2/HfO_2$ dielectric layer preferentially grown in a <100> direction illustrated in FIG. 7C.

Referring to FIG. 8, it may be confirmed that the EOT of the $ZrO_2/HfO_2$ dielectric layer ("C") preferentially grown in the <110> direction decreased by about 9.7%, compared with the $ZrO_2/HfO_2$ dielectric layer ("A") grown in the random orientation. In addition, it may be confirmed that the EOT of the $ZrO_2/HfO_2$ dielectric layer ("D") preferentially grown in the <100> direction decreased by about 29.2%, compared with the $ZrO_2/HfO_2$ dielectric layer ("A") grown in the random orientation.

As described above, it may be confirmed that, when the $ZrO_2/HfO_2$ dielectric layer is grown in a specific direction, for example, a <100> direction or a <110> direction, the EOT decreases and the dielectric constant increases accordingly, compared to the case in which the $ZrO_2/HfO_2$ dielectric layer is grown in a random orientation.

The dielectric layers 420, 520, 620, and 720 having a high dielectric constant, which have been described in the example embodiments, may be applied to various electronic devices such as capacitors.

Figure 9:
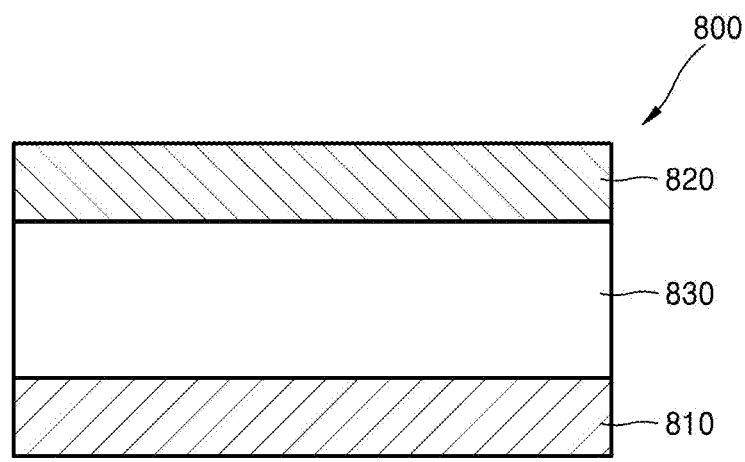
FIG. 9 illustrates an electronic device according to an example embodiment.

FIG. 9 illustrates an electronic device (capacitor) 800 according to an example embodiment.

Referring to FIG. 9, the electronic device 800 includes a lower electrode 810, an upper electrode 820 apart from the lower electrode 810, and a dielectric layer 830 between the lower electrode 810 and the upper electrode 820. At least one of the lower electrode 810 and/or the upper electrode 820 may be, for example, the substrate 410 or 510 in FIG. 1 or 3. The dielectric layer 830 may be, for example, the dielectric layer 420 or 520 illustrated in FIG. 1 or 3. The dielectric layer 830 may include hafnium oxide ($HfO_2$), zirconium oxide ($ZrO_2$), and/or hafnium zirconium oxide ($Hf_xZr_{1-x}O_2$, 0<x<1), which has a tetragonal crystal structure, and may include crystal grains grown in a direction close to a <hk0>, <h00>, and/or <0k0> direction. The dielectric layer 830 may be formed in a form of a thin film having a nanoscale thickness (for example, 10 nm or less, or 5 nm or less). Because the dielectric layer 830 has been described in detail in the above embodiments, a description thereof will be omitted.

The lower electrode 810 may be arranged on a substrate (not illustrated). The substrate may be a portion of a structure supporting the capacitor or a portion of a device connected to the capacitor. The substrate may include a semiconductor material pattern, an insulating material pattern, and/or a conductive material pattern. For example, the substrate may include a semiconductor material such as silicon (Si), germanium (Ge), silicon germanium (SiGe), silicon carbide (SiC), gallium arsenide (GaAs), indium arsenide (InAs), or indium phosphide (InP); an insulating material such as silicon oxide, silicon nitride, or silicon oxynitride; and/or a conductive material such as a metal, a conductive metal nitride, a conductive metal oxide, and/or any combination thereof.

The upper electrode 820 may be apart from the lower electrode 810 and arranged to face the lower electrode 810. Each of the lower electrode 810 and the upper electrode 820 may include conductor such as a metal, a conductive metal nitride, a conductive metal oxide, and/or any combination thereof. The metal may include, for example, ruthenium (Ru), titanium (Ti), tantalum (Ta), niobium (Nb), iridium (Ir), molybdenum (Mo), tungsten (W), and/or platinum (Pt). The conductive metal nitride may include, for example, titanium nitride (TiN), tantalum nitride (TaN), niobium nitride (NbN), molybdenum nitride (MoN), cobalt nitride (CoN), and/or tungsten nitride (WN). The conductive metal oxide may include, for example, platinum oxide (PtO), iridium oxide ($IrO_2$), ruthenium oxide ($RuO_2$), strontium ruthenium oxide ($SrRuO_3$), barium strontium ruthenium oxide (($Ba,Sr)RuO_3$), calcium ruthenium oxide ($CaRuO_3$), and/or lanthanum strontium cobalt oxide (($La,Sr)CoO_3$)

Each of the lower electrode 810 and the upper electrode 820 may have a single material layer and/or a stack structure including a plurality of material layers. For example, in some embodiments each of the lower electrode 810 and the upper electrode 820 may be a single titanium nitride (TiN) layer or a single niobium nitride (NbN) layer. Alternatively, each of the lower electrode 810 and the upper electrode 820 may have a stack structure including at least a first electrode layer including titanium nitride (TiN) and a second electrode layer including niobium nitride (NbN).

The dielectric layer 830 may be directly grown and/or provided on the lower electrode 810 or the upper electrode

820. The dielectric layer 830 may be deposited on the lower electrode 810 or the upper electrode 820 by, for example, ALD. For example, the dielectric layer 830 may be grown on one of the lower electrode 810 or the upper electrode 820, and/or the remainder of the lower electrode 810 or the upper electrode 820 may be grown on the dielectric layer 830. The lower electrode 810 or the upper electrode 820, on which the dielectric layer 830 is grown, may include a material preferentially grown in a specific direction. For example, the lower electrode 810 or the upper electrode 820, on which the dielectric layer 830 is grown, may include titanium nitride (TiN) preferentially grown in a <111> direction and/or cobalt titanium nitride (Co—TiN) grown in a <111> direction. In this case, the dielectric layer 830, which a tetragonal crystal structure and includes hafnium oxide (HfO$_2$), zirconium oxide (ZrO$_2$), and/or hafnium zirconium oxide (Hf$_x$Zr$_{1-x}$O$_2$, 0<x<1) including crystal grains grown in a <110> direction, may be formed.

Figure 10:
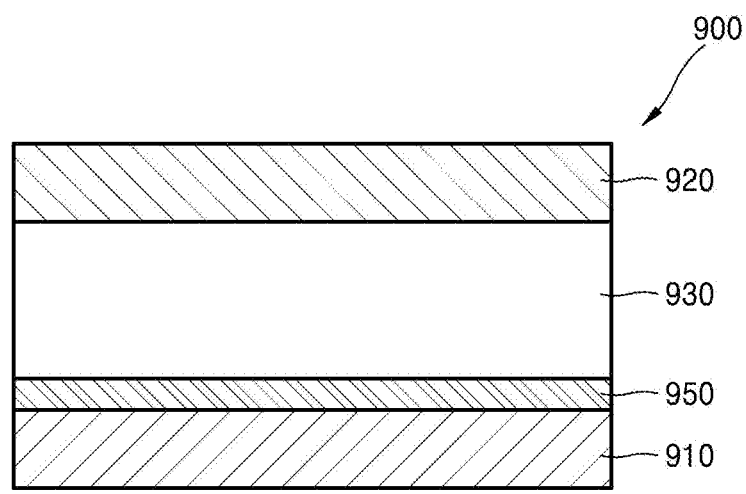
FIG. 10 illustrates an electronic device according to another example embodiment.

FIG. 10 illustrates an electronic device (capacitor) 900 according to another example embodiment.

Referring to FIG. 10, the electronic device 900 includes a lower electrode 910, an upper electrode 920 apart from the lower electrode 910, a dielectric layer 930 between the lower electrode 910 and the upper electrode 920, and a material layer 950 between the lower electrode 910 and the dielectric layer 930. The dielectric layer 930 may be, for example, the dielectric layer 620 or 720 illustrated in FIG. 4 or 5. The material layer 950 may be, for example, the material layer 630 or 730 illustrated in FIG. 4 or 5. Because the lower electrode 910 and the upper electrode 920 are the same as those illustrated in FIG. 9, a detailed description thereof will be omitted.

The material layer 950 may be deposited on the lower electrode 910, and the dielectric layer 930 may be deposited on the material layer 950. The material layer 950 may include, for example, niobium titanium oxide (Nb—TiO$_2$) and/or silver oxide (AgO$_2$). In this case, the dielectric layer 930 formed on the material layer 950 may have a tetragonal crystal structure and may include hafnium oxide (HfO$_2$), zirconium oxide (ZrO$_2$), and/or hafnium zirconium oxide (Hf$_x$Zr$_{1-x}$O$_2$, 0<x<1) including crystal grains preferentially grown in a <110> direction.

The material layer 950 may include, for example, niobium nitride (NbN). In this case, the dielectric layer 930 formed on the material layer 950 may have a tetragonal crystal structure and may include hafnium oxide (HfO$_2$), zirconium oxide (ZrO$_2$), and/or hafnium zirconium oxide (Hf$_x$Zr$_{1-x}$O$_2$, 0<x<1) including crystal grains preferentially grown in a <100> direction.

According to another aspect, an electronic apparatus including the above-described electronic device may be provided. The electronic apparatus may have memory characteristics and may be, for example, a dynamic random access memory (DRAM). In addition, the electronic apparatus may be a structure in which a capacitor and a field effect transistor are electrically connected. In this case, the capacitor may be the above-described electronic device.

Figure 11:
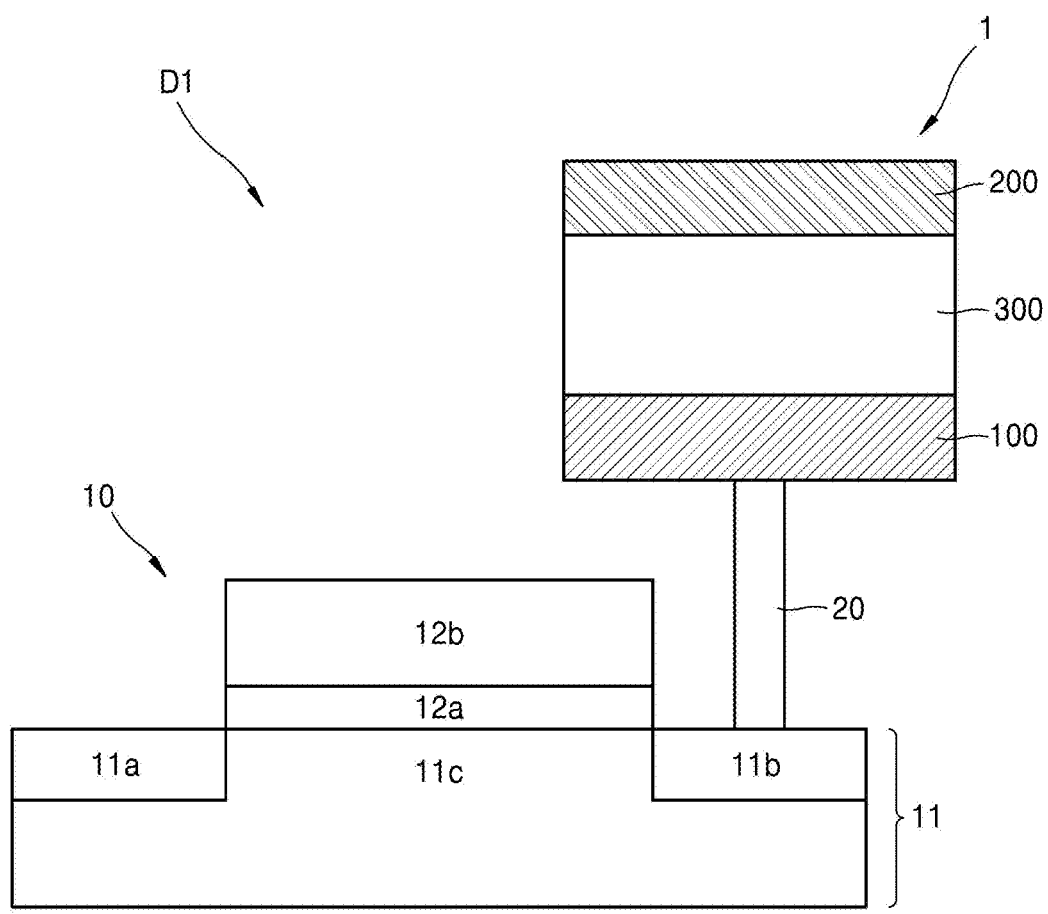
FIG. 11 is a schematic diagram of an electronic apparatus according to an example embodiment.

FIG. 11 is a schematic diagram of an electronic apparatus D1 according to an example embodiment.

Referring to FIG. 11, the electronic apparatus D1 may include a structure in which a capacitor 1 and a field effect transistor 10 are electrically connected to each other by a contact 20. The capacitor 1 includes a lower electrode 100, an upper electrode 200, and a dielectric layer 300 between the lower electrode 100 and the upper electrode 200. The capacitor 1 may be the capacitor 800 or 900 illustrated in FIG. 9 or 10. Because this has been described above, a description thereof will be omitted.

The field effect transistor 10 may include a substrate 11 and a gate electrode 12b provided on the substrate 11. A gate insulating layer 12a may be further provided between the substrate 11 and the gate electrode 12b.

The substrate 11 may include a source 11a, a drain 11b, and a channel 11c electrically connected to the source 11a and the drain 11b. The source 11a may be electrically connected or in contact with one end of the channel 11c, and the drain 11b may be electrically connected or in contact with the other end of the channel 11c. In some embodiments, the channel 11c may be defined as a substrate area between the source 11a and the drain 11b in the substrate 11.

The substrate 11 may include a semiconductor material. The substrate 11 may include, for example, a semiconductor material such as silicon (Si), germanium (Ge), silicon germanium (SiGe), silicon carbide (SiC), gallium arsenide (GaAs), indium arsenide (InAs), and/or indium phosphide (InP). In addition, the substrate 11 may include a silicon on insulator (SOI) substrate.

In some embodiments, the source 11a, the drain 11b, and the channel 11c may be independently formed by implanting impurities into different areas of the substrate 11. In this case, the source 11a, the channel 11c, and the drain 11b may include a substrate material as a base material. The source 11a and the drain 11b may include a conductive material. In this case, the source 11a and the drain 11b may include, for example, a metal, a metal compound (e.g., a metal nitride, metal carbide, and/or metal oxide), and/or a conductive polymer.

The channel 11c may be implemented as a separate material layer (thin film) (not illustrated). In this case, for example, the channel 11c may include at least one of Si, Ge, SiGe, Group III-V semiconductor, oxide semiconductor, nitride semiconductor, oxynitride semiconductor, two-dimensional (2D) material, quantum dot, and/or organic semiconductor. For example, the oxide semiconductor may include InGaZnO, the 2D material may include transition metal dichalcogenide (TMD) and/or graphene, and the quantum dot may include colloidal quantum dot (QD) or a nanocrystal structure.

The gate electrode 12b may be apart from the substrate 11 and arranged to face the channel 11c. The gate electrode 12b may include at least one of metal, metal nitride, metal carbide, and polysilicon. For example, the metal may include at least one of aluminum (Al), tungsten (W), molybdenum (Mo), titanium (Ti), and/or tantalum (Ta), and the metal nitride layer may include at least one of a titanium nitride (TiN) film and/or a tantalum nitride (TaN) film. The metal carbide may include at least one of aluminum and/or silicon-doped (or silicon-contained) metal carbide. For example, the metal carbide may include TiAlC, TaAlC, TiSiC, and/or TaSiC.

The gate electrode 12b may have a structure in which a plurality of materials are stacked. For example, the gate electrode 12b may have a stack structure of a metal nitride layer/metal layer such as TiN/Al, and/or a stack structure of a metal nitride layer/metal carbide layer/metal layer such as TiN/TiAlC/W. However, the above-described materials are merely examples, and the present disclosure is not limited thereto.

A gate insulating layer 12a may be further arranged between the substrate 11 and the gate electrode 12b. The gate insulating layer 12a may include a paraelectric material and/or a high-k dielectric material and may have a dielectric constant of about 20 to about 70.

The gate insulating layer 12a may include silicon oxide, silicon nitride, aluminum oxide, hafnium oxide, zirconium oxide, and/or the like, and/or may include a 2D insulator such as hexagonal boron nitride (h-BN). For example, the gate insulating layer 12a may include silicon oxide ($SiO_2$), silicon nitride ($SiN_x$), and/or the like, and/or may include hafnium oxide ($HfO_2$), hafnium silicon oxide ($HfSiO_4$), lanthanum oxide ($La_2O_3$), lanthanum aluminum oxide ($LaAlO_3$), zirconium oxide ($ZrO_2$), hafnium zirconium oxide ($HfZrO_2$), zirconium silicon oxide ($ZrSiO_4$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), red scandium tantalum oxide ($PbSc_{0.5}Ta_{0.5}O_3$), lead zinc niobate ($PbZnNbO_3$), and/or the like. In addition, the gate insulating layer 12a may include a metal nitride oxide such as aluminum oxynitride (AlON), zirconium oxynitride (ZrON), hafnium oxynitride (HfON), lanthanum oxynitride (LaON), and/or yttrium oxynitride (YON), silicates such as ZrSiON, HfSiON, YSiON, and/or LaSiON, and/or aluminate such as ZrAlON and/or HfAlON. In some embodiments, the gate insulating layer 12a may include the above-described dielectric layers 420, 520, 620, and/or 720. The gate insulating layer 12a may form a gate stack together with the gate electrode 12b.

One of the lower and upper electrodes 100 and 200 of the capacitor 1 and one of the source 11a and the drain 11b of the field effect transistor 10 may be electrically connected to each other by the contact 20, the present disclosure is not limited thereto. For example, in some embodiments, one of the source 11a and the drain 11b may directly contact one of the lower and upper electrodes 100 and 200. The contact 20 may include a suitable conductive material, for example, tungsten, copper, aluminum, polysilicon, and the like.

The arrangement of the capacitor 1 and the field effect transistor 10 may be variously modified. For example, the capacitor 1 may be arranged on the substrate 11, and/or may be buried in the substrate 11. On the other hand, although FIG. 11 illustrates the electronic apparatus D1 including one capacitor 1 and one field effect transistor 10, an electronic apparatus D10 including a plurality of capacitors and a plurality of field effect transistors may also be implemented, as illustrated in FIG. 12.

Figure 12:
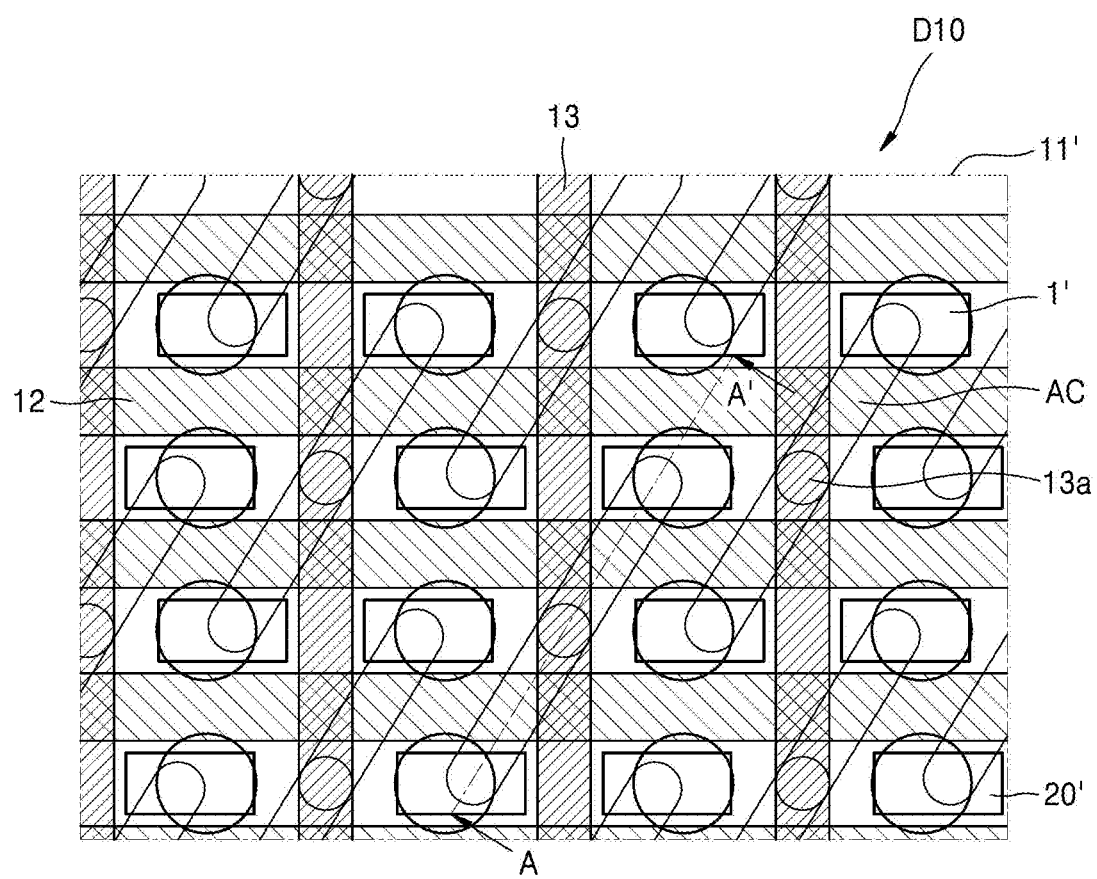
FIG. 12 illustrates an electronic apparatus according to another example embodiment.
Figure 12:
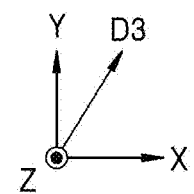

FIG. 12 illustrates the electronic apparatus D10 according to another example embodiment.

Referring to FIG. 12, the electronic apparatus D10 may include a structure in which a plurality of capacitors and a plurality of field effect transistors are repeatedly arranged. The electronic apparatus D10 may include: a plurality of field effect transistors, which each include a substrate 11' including a source, a drain, and a channel, and a gate stack 12; a contact structure 20' arranged on the substrate 11' so as not to overlap the gate stack 12; and a capacitor 1' arranged on the contact structure 20', and may further include a bit line structure 13 electrically connecting the field effect transistors.

FIG. 12 illustrates an example electronic apparatus D10 in which both the contact structure 20' and the capacitor 1' are repeatedly arranged in the X and Y directions, but the present disclosure is not limited thereto. For example, the contact structure 20' may be arranged in the X and Y directions, and/or the capacitor 1' may be arranged in a hexagonal shape such as a honeycomb structure.

Figure 13:
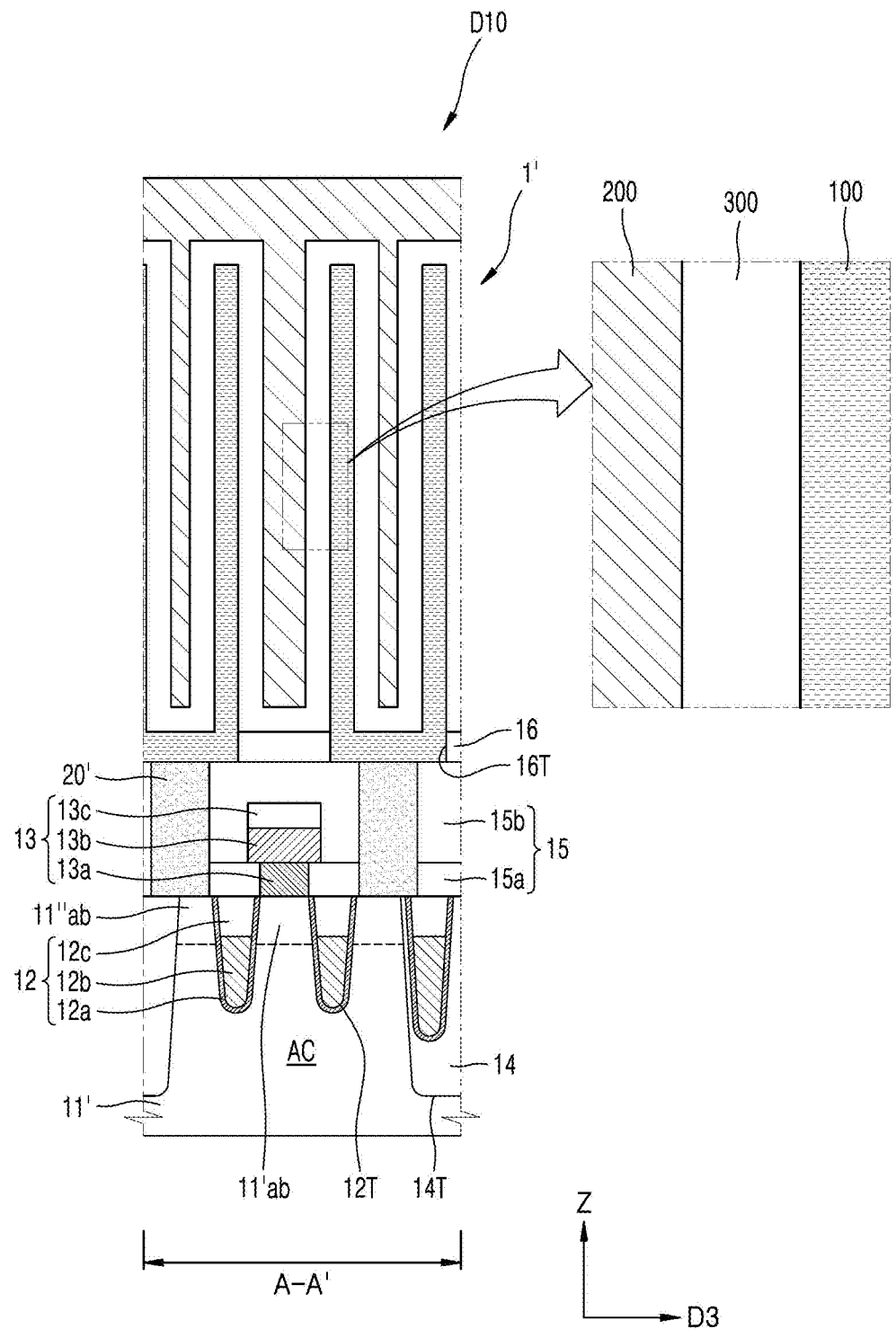
FIG. 13 is a cross-sectional view of the electronic device taken along line A-A' of FIG. 12.

FIG. 13 is a cross-sectional view of the electronic device 10D taken along line A-A' of FIG. 12.

Referring to FIG. 13, the substrate 11' may have a shallow trench isolation (STI) structure including a device isolation film 14. The device isolation film 14 may be a single layer including one type of insulating film or multiple layers including a combination of two or more types of insulating films. The device isolation film 14 may include a device isolation trench 14T in the substrate 11', and the device isolation trench 14T may be filled with an insulating material. The insulating material may include at least one of fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), and/or tonen silazene (TOSZ), but the present disclosure is not limited thereto.

The substrate 11' may further include an active area AC defined by the device isolation film 14, and a gate line trench 12T parallel to the upper surface of the substrate 11' and extending in the X direction. The active area AC may have a relatively long island shape having a minor axis and a major axis. As illustrated in FIG. 12, the major axis of the active area AC may be arranged in a direction D3 parallel to the upper surface of the substrate 11'.

The gate line trench 12T may be arranged in the active area AC or arranged to cross the active area AC at a certain depth from the upper surface of the substrate 11'. The gate line trench 12T may also be arranged inside the device isolation trench 14T. The gate line trench 12T inside the device isolation trench 14T may have a lower bottom surface than the gate line trench 12T of the active area AC. A first source/drain 11'ab and a second source/drain 11"ab may be arranged at the upper portion of the active area AC positioned on both sides of the gate line trench 12T.

The gate stack 12 may be arranged inside the gate line trench 12T. Specifically, a gate insulating layer 12a, a gate electrode 12b, and a gate capping layer 12c may be sequentially arranged inside the gate line trench 12T. The gate insulating layer 12a and the gate electrode 12b may be substantially the same as those described above, and the gate capping layer 12c may include an insulator like at least one of silicon oxide, silicon oxynitride, and/or silicon nitride. The gate capping layer 12c may be arranged on the gate electrode 12b to fill the remaining portion of the gate line trench 12T.

A bit line structure 13 may be arranged on the first source/drain 11'ab. The bit line structure 13 may be parallel to the upper surface of the substrate 11' and extend in the Y direction. The bit line structure 13 may be electrically connected to the first source/drain 11'ab and may include a bit line contact 13a, a bit line 13b, and a bit line capping layer 13c, which are sequentially stacked on the substrate. For example, the bit line contact 13a may include polysilicon, the bit line 13b may include a metal material, and the bit line capping layer 13c may include an insulating material such as silicon nitride and/or silicon oxynitride.

Although FIG. 13 illustrates an example case in which the bit line contact 13a has a bottom surface at the same level as the upper surface of the substrate 11', the bit line contact 13a may extend from the upper surface of the substrate 11' to the inside of a recess (not illustrated) formed to a predetermined depth, and thus, the bottom surface of the bit line contact 13a may be lower than the upper surface of the substrate 11'.

The bit line structure 13 may further include a bit line intermediate layer (not illustrated) between the bit line contact 13a and the bit line 13b. The bit line intermediate layer may include a metal silicide such as tungsten silicide or a metal nitride such as tungsten nitride. In addition, a bit line spacer (not illustrated) may be further formed on a sidewall of the bit line structure 13. The bit line spacer may have a single layer structure or a multilayer structure and may include an insulating material such as silicon oxide, silicon oxynitride, or silicon nitride. In addition, the bit line spacer may further include an air space (not illustrated).

The contact structure 20' may be arranged on the second source/drain 11"ab. The contact structure 20' and the bit line structure 13 may be arranged on different sources/drains on the substrate. The contact structure 20' may have a structure in which a lower contact pattern (not illustrated), a metal silicide layer (not illustrated), and an upper contact pattern (not illustrated) are sequentially stacked on the second source/drain 11"ab. The contact structure 20' may further include a barrier layer (not illustrated) surrounding a bottom surface and side surfaces of the upper contact pattern. For example, the lower contact pattern may include polysilicon, the upper contact pattern may include a metal material, and the barrier layer may include a conductive metal nitride.

The capacitor 1' may be electrically connected to the contact structure 20' and arranged on the substrate 11'. For example, the capacitor 1' may include a lower electrode 100 electrically connected to the contact structure 20', a dielectric layer 300 arranged on the lower electrode 100, and an upper electrode 200 arranged on the dielectric layer 300. The dielectric layer 300 may be arranged on the lower electrode 100 so as to be parallel to the surface of the lower electrode 100. Because the lower electrode 100, the dielectric layer 300, and the upper electrode 200 of the capacitor 1' have been described above, a description thereof will be omitted.

The interlayer insulating layer 15 may be further arranged between the capacitor 1' and the substrate 11'. The interlayer insulating layer 15 may be arranged in a space between the capacitor 1' and the substrate 11', in which other structures are not arranged. Specifically, the interlayer insulating layer 15 may be arranged to cover lines and/or electrode structures such as the bit line structure 13, the contact structure 20', and the gate stack 12 on the substrate. For example, the interlayer insulating layer 15 may surround walls of the contact structure 20'. The interlayer insulating layer 15 may include a first interlayer insulating layer 15a surrounding the bit line contact 13a, and a second interlayer insulating layer 15b covering the side surfaces and/or the upper surfaces of the bit line 13b and the bit line capping layer 13c.

The lower electrode 100 of the capacitor 1' may be arranged on the interlayer insulating layer 15. For example, the lower electrode 100 of the capacitor 1' may be arranged on the second interlayer insulating layer 15b. In addition, when a plurality of capacitors 1' are arranged, bottom surfaces of a plurality of lower electrodes 100 may be separated from each other by an etch stop layer 16. For example, the etch stop layer 16 may include an opening 16T, and the bottom surface of the lower electrode 100 of the capacitor 1' may be arranged in the opening 16T. In some embodiments, the etch stop layer 16 may include an insulator.

Figure 14:
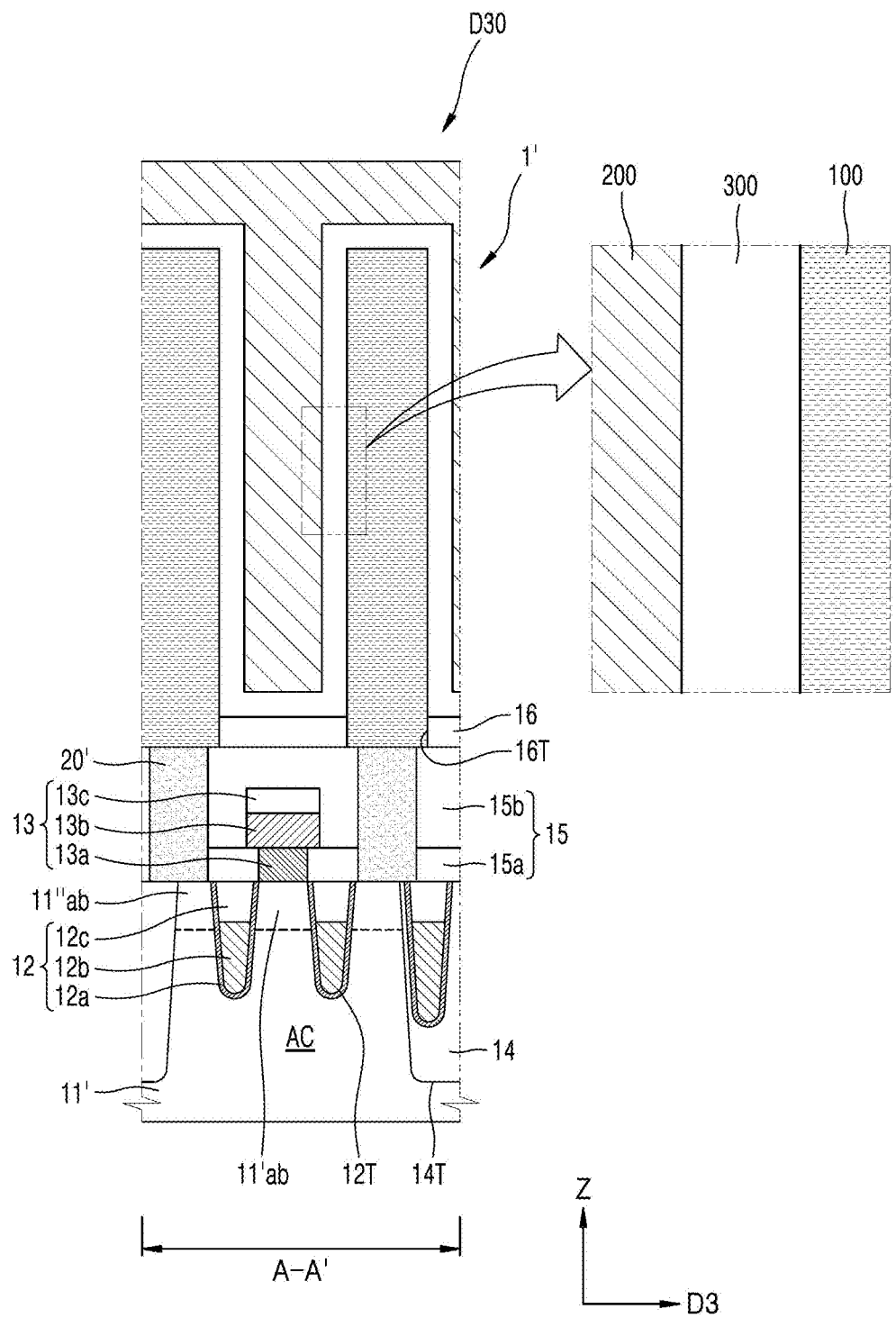
FIG. 14 illustrates an electronic apparatus according to another example embodiment.

As illustrated in FIG. 13, the lower electrode 100 may have a cup shape and/or a cylinder shape with a closed bottom. As another example, as in the electronic apparatus D30 illustrated in FIG. 14, the lower electrode 100 may have a pillar shape such as a cylinder, a square pillar, and/or a polygonal pillar extending in a vertical direction (e.g., Z direction). The capacitor 1' may further include a support (not illustrated) that prevents the lower electrode 100 from tilting or collapsing, and the support may be arranged on a sidewall of the lower electrode 100.

The electronic devices or the electronic apparatuses according to the above-described embodiments may be applied to various application fields. For example, the electronic devices or the electronic devices according to the embodiments may be applied as logic devices and/or memory devices. The electronic devices and the electronic apparatuses according to the embodiments may be used for arithmetic operations, program execution, temporary data retention, and the like in devices such as mobile devices, computers, laptop computers, sensors, network devices, neuromorphic devices, and/or the like. In addition, the electronic devices and the electronic apparatuses according to the embodiments may be useful for devices in which an amount of data transmission is large and data transmission is continuously performed.

Figure 15:
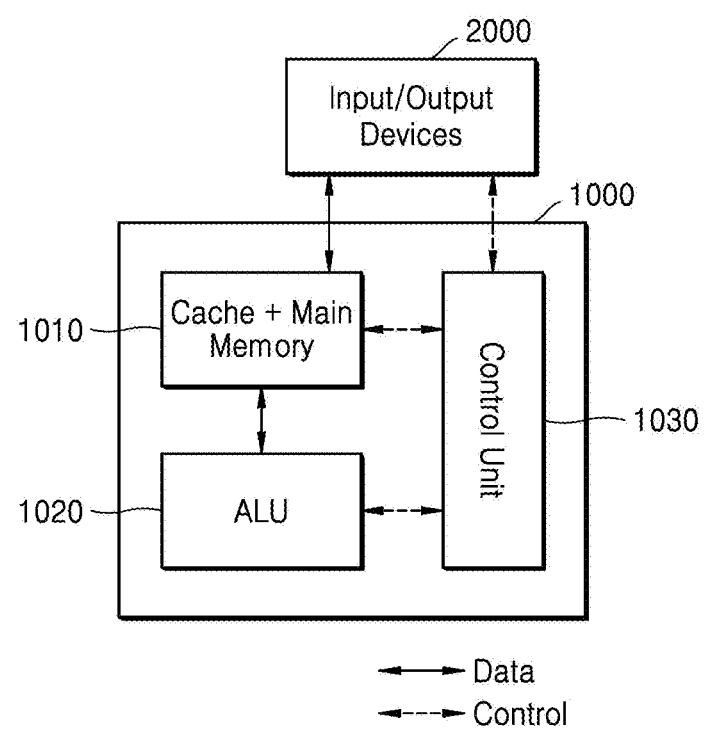
FIGS. 15 and 16 are conceptual diagrams schematically illustrating a device architecture applicable to an apparatus according to an example embodiment.
Figure 16:
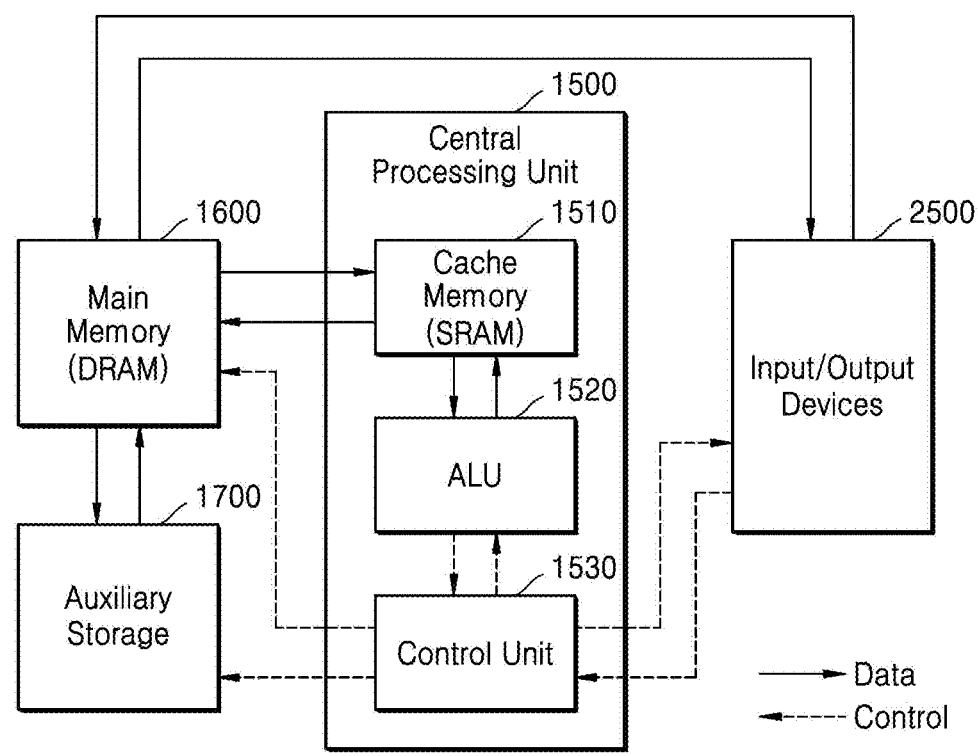

FIGS. 15 and 16 are conceptual diagrams schematically illustrating a device architecture applicable to an apparatus according to an example embodiment.

Referring to FIG. 15, an electronic device architecture 1000 may include a memory unit 1010, an arithmetic logic unit (ALU) 1020, and a control unit 1030. The memory unit 1010, the ALU 1020, and the control unit 1030 may be electrically connected to each other. For example, the electronic device architecture 1000 may be implemented as a single chip including the memory unit 1010, the ALU 1020, and the control unit 1030. The control unit 1030 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc. Similarly, though the electronic device architecture 1000 is illustrated as including the ALU 1020, the electronic device architecture 1000 is not limited, and may contain additional and/or alternative processing circuitry.

The memory unit 1010, the ALU 1020, and the control unit 1030 may be interconnected in an on-chip manner via a metal line to perform direct communication. The memory unit 1010, the ALU 1020, and the control unit 1030 may be monolithically integrated on a single substrate to constitute a single chip. Input/output devices 2000 may be connected to the electronic device architecture (chip) 1000. The input/output device 2000 may include, for example, at least one of a touch pad, a microphone, a speaker, a keyboard, and/or a display. In addition, the memory unit 1010 may include both a main memory and a cache memory. The electronic device architecture (chip) 1000 may be an on-chip memory processing unit. The memory unit 1010, the ALU 1020, and/or the control unit 1030 may each include the above-described electronic device.

Referring to FIG. 16, a cache memory 1510, an ALU 1520, and a control unit 1530 may constitute a central processing unit (CPU) 1500, and the cache memory 1510 may include a static random access memory (SRAM). The control unit 1530 may include processing circuitry such as hardware including logic circuits; a hardware/software combination such as a processor executing software; or a combination thereof. For example, the processing circuitry more specifically may include and/or be included in, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc. Similarly, though illustrated as a CPU 1500 and including the ALU 1520, the example embodiment is not limited thereto, and may contain additional and/or alternative processing circuitry.

Apart from the CPU 1500, a main memory 1600 and an auxiliary storage 1700 may be provided. The main memory 1600 may be, for example, a DRAM and/or may include the above-described semiconductor device. In some cases, the electronic device architecture may be implemented in a form in which computing unit devices and memory unit devices are adjacent to each other on a single chip, without distinction of sub-units.

According to the above-described example embodiments, the dielectric layer includes hafnium oxide ($HfO_2$), zirconium oxide ($ZrO_2$), and/or hafnium zirconium oxide ($Hf_xZr_{1-x}O_2$, $0<x<1$)), which has the tetragonal crystal structure, and includes crystal grains grown in a specific direction (that is, a direction close to a <hk0>, <h00>, and/or <0k0> direction), and thus, the dielectric layer may have a higher dielectric constant. When the dielectric layer is applied to a capacitor, breakdown voltage and leakage current characteristics may be satisfied and a high capacitance may be secured while the dielectric layer is maintained at a constant thickness. Although the embodiments have been described above, these are merely examples, and various modifications may be made therefrom by those of ordinary skill in the art.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A dielectric thin-film structure comprising:
    a substrate; and
    a dielectric layer on the substrate, the dielectric layer including
        a tetragonal crystal structure, and
        crystal grains including a proportion of the crystal grains preferentially oriented such that a direction of a crystal lattice perpendicular to a <001> direction of the crystal lattice is parallel to or forms an angle of less than 45 degrees with an out-of-plane orientation.
2. The dielectric thin-film structure of claim 1, wherein the direction of the crystal lattice perpendicular to the <001> direction of the crystal lattice includes at least one of a <hk0>, <h00>, or <0k0> direction of the crystal lattice.
3. The dielectric thin-film structure of claim 1, wherein the dielectric layer comprises at least one of hafnium oxide, zirconium oxide, or hafnium zirconium oxide.
4. The dielectric thin-film structure of claim 1, wherein the proportion of preferentially oriented crystal grains in the dielectric layer is 10% or more.
5. The dielectric thin-film structure of claim 1, wherein the dielectric layer is grown on the substrate.
6. The dielectric thin-film structure of claim 5, wherein the substrate comprises cobalt titanium nitride preferentially grown in a <111> direction.
7. The dielectric thin-film structure of claim 1, wherein the substrate comprises cobalt titanium nitride preferentially grown in a <111> direction.
8. The dielectric thin-film structure of claim 1, further comprising:
    a material layer between the substrate and the dielectric layer.
9. The dielectric thin-film structure of claim 8, wherein the material layer comprises at least one of niobium titanium oxide or silver oxide.
10. The dielectric thin-film structure of claim 9, wherein the dielectric layer comprises crystal grains preferentially grown in a <110> direction.
11. The dielectric thin-film structure of claim 8, wherein the material layer comprises niobium nitride.
12. The dielectric thin-film structure of claim 11, wherein the dielectric layer comprises crystal grains preferentially grown in a <100> direction.
13. A capacitor comprising:
    a lower electrode;
    an upper electrode; and
    a dielectric layer between the lower electrode and the upper electrode, the dielectric layer including
        a tetragonal crystal structure, and
        crystal grains including a proportion of the crystal grains preferentially oriented such that a direction of a crystal lattice perpendicular to a <001> direction of the crystal lattice is parallel to or forms an angle of less than 45 degrees with an out-of-plane orientation.
14. The capacitor of claim 13, wherein the direction of the crystal lattice perpendicular to the <001> direction of the crystal lattice includes at least one of a <hk0>, <h00>, or <0k0> direction of the crystal lattice.
15. The capacitor of claim 13, wherein the proportion of preferentially oriented crystal grains is 10% or more.
16. The capacitor of claim 13, wherein the dielectric layer is grown on the lower electrode.
17. The capacitor of claim 16, wherein the lower electrode comprises at least one of titanium nitride or cobalt titanium nitride preferentially grown in a <111> direction.
18. The capacitor of claim 13, further comprising a material layer between the dielectric layer and at least one of the lower electrode or the upper electrode.
19. The capacitor of claim 18, wherein the material layer comprises at least one of niobium titanium oxide, silver oxide, or niobium nitride.
20. An electronic apparatus comprising:
    a field effect transistor; and
    the capacitor of claim 13, the capacitor electrically connected to the field effect transistor.

* * * * *